(12) United States Patent
Hirose

(10) Patent No.: US 12,159,799 B2
(45) Date of Patent: Dec. 3, 2024

(54) CONTAINER FOR TRANSPORTING SEMICONDUCTOR WAFER

(71) Applicant: Achilles Corporation, Tokyo (JP)

(72) Inventor: Kenichi Hirose, Tokyo (JP)

(73) Assignee: Achilles Corporation, Tokyo (JP)

( * ) Notice: Subject to any disclaimer, the term of this patent is extended or adjusted under 35 U.S.C. 154(b) by 0 days.

(21) Appl. No.: 18/246,007

(22) PCT Filed: Mar. 30, 2022

(86) PCT No.: PCT/JP2022/016105
§ 371 (c)(1),
(2) Date: Mar. 20, 2023

(87) PCT Pub. No.: WO2023/188147
PCT Pub. Date: Oct. 5, 2023

(65) Prior Publication Data
US 2023/0317485 A1    Oct. 5, 2023

(51) Int. Cl.
*H01L 21/673* (2006.01)
(52) U.S. Cl.
CPC .. *H01L 21/67386* (2013.01); *H01L 21/67369* (2013.01)
(58) Field of Classification Search
CPC ......... H01L 21/67383; H01L 21/67386; H01L 21/67369; H01L 21/67353; H01L 21/67379; H01L 21/67373; H01L 21/67366
USPC .......................................... 206/710–712, 832
See application file for complete search history.

(56) References Cited

U.S. PATENT DOCUMENTS

| | | | |
|---|---|---|---|
| 6,286,684 B1* | 9/2001 | Brooks | H01L 21/67396 206/523 |
| 6,988,620 B2* | 1/2006 | Haggard | H01L 21/67386 206/710 |
| 6,988,621 B2* | 1/2006 | Forsyth | H01L 21/67369 206/710 |
| 7,131,248 B2* | 11/2006 | Pylant | H01L 21/67369 53/445 |

(Continued)

FOREIGN PATENT DOCUMENTS

| | | |
|---|---|---|
| JP | 2015149498 A | 8/2015 |
| JP | 2017508291 A | 3/2017 |

(Continued)

OTHER PUBLICATIONS

International Search Report and Written Opinion, mailed May 17, 2022, for International Application Serial No. PCT/JP2022/016105 filed on Mar. 30, 2022.

*Primary Examiner* — Chun Hoi Cheung
(74) *Attorney, Agent, or Firm* — K&L Gates LLP; Louis C. Cullman; Giorgios N. Kefallinos

(57) ABSTRACT

A container (1) for transporting a semiconductor wafer includes: a container body (10) having one end provided with an opening (11) and the other end provided with a mounter (12) that faces the opening (11) and on which stacked wafers are housed; and a cover (20) that closes the opening (11). The container body (10) includes: body side walls (14) having an arc shape, disposed upright on the mounter (12), sectioning a housing (13) that houses the wafers; and auxiliary walls (14a) that are disposed upright and folded toward a back surface on both edges of the body side walls (14).

1 Claim, 9 Drawing Sheets

(56) References Cited

U.S. PATENT DOCUMENTS

| | | | |
|---|---|---|---|
| 7,565,980 B2* | 7/2009 | Forsyth | H01L 21/67369 |
| | | | 206/710 |
| 7,578,392 B2* | 8/2009 | Brooks | H01L 21/67373 |
| | | | 206/832 |
| 8,286,797 B2* | 10/2012 | Pylant | H01L 21/67379 |
| | | | 206/454 |
| 8,528,737 B2* | 9/2013 | Pylant | H01L 21/67373 |
| | | | 206/454 |
| 8,813,964 B2* | 8/2014 | Pylant | H01L 21/67373 |
| | | | 206/454 |
| 11,335,615 B2* | 5/2022 | Nishijima | H01L 21/67373 |
| 2005/0133403 A1* | 6/2005 | Cleaver | B65D 81/07 |
| | | | 206/832 |
| 2006/0180499 A1* | 8/2006 | Forsyth | H01L 21/67369 |
| | | | 206/710 |
| 2007/0012594 A1* | 1/2007 | Forsyth | H01L 21/67386 |
| | | | 206/832 |
| 2007/0187286 A1* | 8/2007 | Pylant | H01L 21/67386 |
| | | | 206/710 |
| 2011/0049006 A1 | 3/2011 | Pylant et al. | |
| 2016/0365265 A1 | 12/2016 | Kirkland et al. | |
| 2020/0105632 A1* | 4/2020 | Nishijima | H01L 23/13 |

FOREIGN PATENT DOCUMENTS

| | | |
|---|---|---|
| JP | 2018174177 A | 11/2018 |
| JP | 2002334923 A | 11/2022 |
| TW | M619380 U | 11/2021 |

* cited by examiner

CONTAINER FOR TRANSPORTING SEMICONDUCTOR WAFER

CROSS REFERENCE TO RELATED APPLICATION

This application is a national phase filing of PCT/JP2022/016105, filed on Mar. 30, 2022, the entire disclosure of which is incorporated herein by reference.

TECHNICAL FIELD

The present disclosure relates to a container for transporting a semiconductor wafer.

BACKGROUND ART

Examples of a container for transporting a semiconductor wafer, in which a semiconductor wafer is housed and transported, include a container for housing a wafer, disclosed in Patent Literature 1.

The container for housing a wafer, disclosed in Patent Literature 1, is molded with a synthetic resin material. In the container for housing a wafer, a housing including a plurality of body side walls each having a generally cylindrical shape is disposed on a container body. A cushioning material and the like are placed on top and bottom stages in the housing. Wafers are housed so that the wafers and interlayer sheets (sheets made of a synthetic resin, dust-free paper, molded products made of a synthetic resin, or the like) are alternately interposed between the top and bottom cushioning materials. The container for housing a wafer is configured so that the container body is covered with a cover including a cover side wall having a generally cylindrical shape. In a case in which the cover is placed over the container body, the container body and the cover are retained to each other with a retention mechanism such that the wafers are housed in a sealing state. The container for housing a wafer is transported in the sealing state.

CITATION LIST

Patent Literature

Patent Literature 1: Unexamined Japanese Patent Application Publication No. 2018-174177

SUMMARY OF INVENTION

Technical Problem

In the container for housing a wafer, made of a synthetic resin, the housing of the container body that houses the wafers includes body side walls having an arc shape and disposed upright on a bottom face, and has a generally cylindrical shape. The body side walls of the housing are molded so that the body side walls are fitted to the outer diameters of the wafers.

In resin molding, however, due to shrinkage after the molding, the body side walls tend to shrink to lean toward an inner side (central side) while approaching from the bottom face portion to the opening of the container body. The lean of the body side walls toward the inner side may cause the wafers to come into contact with the body side walls and also cause the wafers to be damaged when the wafers are housed in the housing or when the wafers are taken out.

To prevent the body side walls and the wafer from coming into contact with each other, the inner diameter of the housing can also be designed to be rather large in previous consideration of the shrinkage of the body side walls. Thus, however, gaps are generated between the wafers and the body side walls, particularly in the bottom face of the container body. Therefore, it is impossible to prevent the wafer from moving in a horizontal direction, and the wafers may be damaged.

The present disclosure was made under such problems of the conventional technology, with an objective to provide a container for transporting a semiconductor wafer, in which a wafer is reliably prevented from moving in a horizontal direction, and the wafer is prevented from being damaged when the wafer is housed in a housing or taken out of the housing.

Solution to Problem

In order to achieve the objective described, a container for transporting a semiconductor wafer, according to the present disclosure, is a container for transporting a semiconductor wafer, including:
  a container body having one end provided with an opening and another end provided with a mounter that faces the opening and on which stacked wafers are housed; and
  a cover that closes the opening, wherein
  the container body comprises:
    body side walls having an arc shape, disposed upright on the mounter, and sectioning a housing that houses the wafers; and
    auxiliary walls that are disposed upright and folded toward a back surface on both edges of the body side walls.
  It is preferable that:
  in the container body, the auxiliary walls serve as first guide elements, and
  in the cover, second guide elements are formed, the second guide element being guided along the first guide elements and being configured to keep a concentricity state between the container body and the cover.

Advantageous Effects of Invention

In accordance with the present disclosure, there can be provided a container for transporting a semiconductor wafer, in which a wafer is reliably prevented from moving in a horizontal direction, and the wafer is prevented from being damaged when the wafer is housed in a housing or taken out of the housing.

DESCRIPTION OF EMBODIMENTS

Figure 1A:
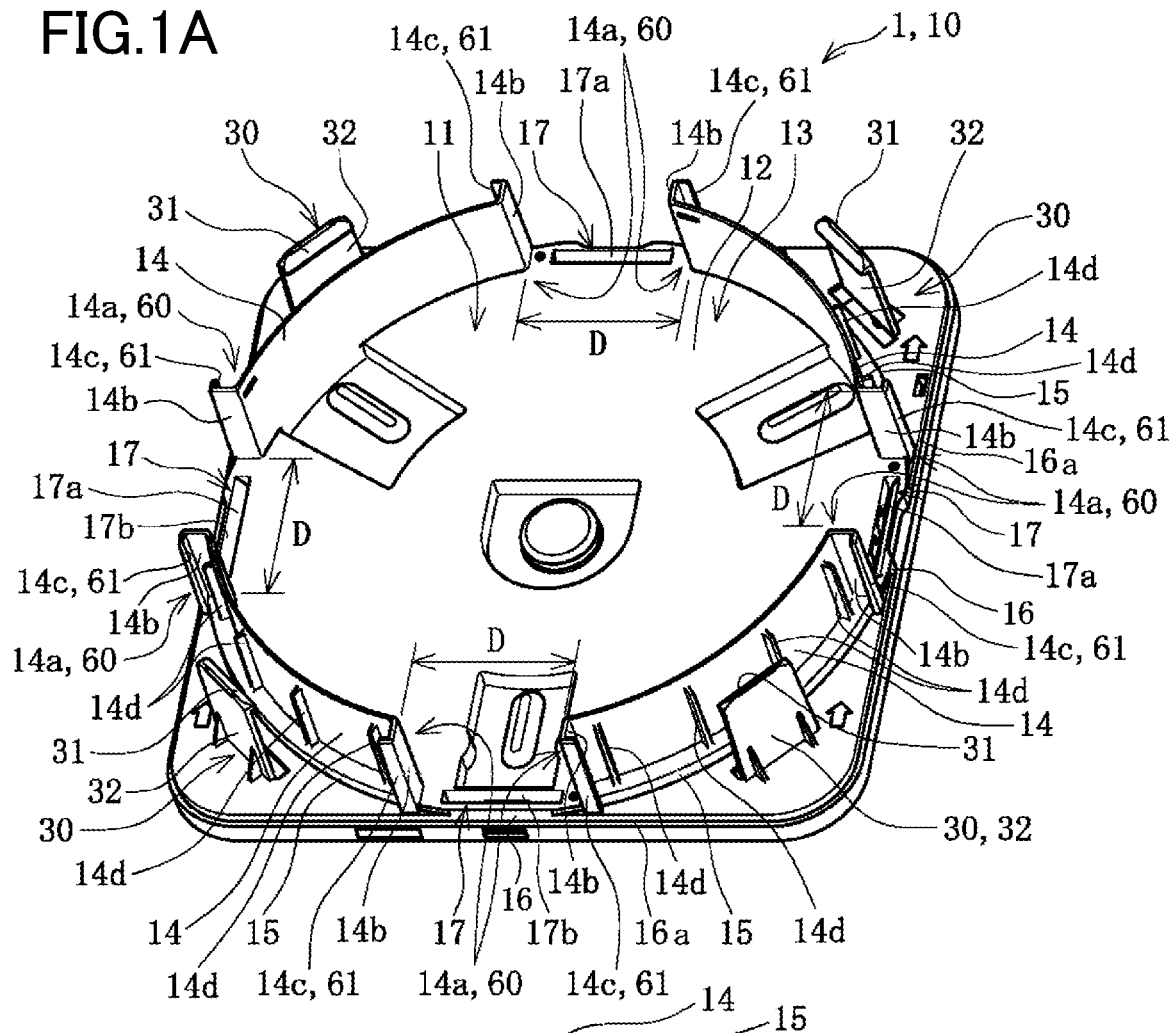
FIG. 1A is a schematic perspective view of a container body of an embodiment of a container for transporting a semiconductor wafer of the present disclosure.

An embodiment of a container for transporting a semiconductor wafer of the present disclosure is described in detail below with reference to the drawings.

A container 1 for transporting a semiconductor wafer (hereinafter simply referred to as "container for transporting wafer") according to an embodiment of the present disclosure includes a container body 10 and a cover 20, as illustrated in FIGS. 1A to 9. Each of the container body 10 and the cover 20 is molded with a synthetic resin material. Unless otherwise described, each member of the container body 10 is integrally formed, and each member of the cover 20 is integrally formed.

One end of the container body 10 is provided with an opening 11, and the other end of the container body 10 is provided with a mounter 12 that faces the opening 11. Semiconductor wafers (hereinafter simply referred to as "wafers") W are stacked and housed on the mounter 12.

Figures 3A, 3B:
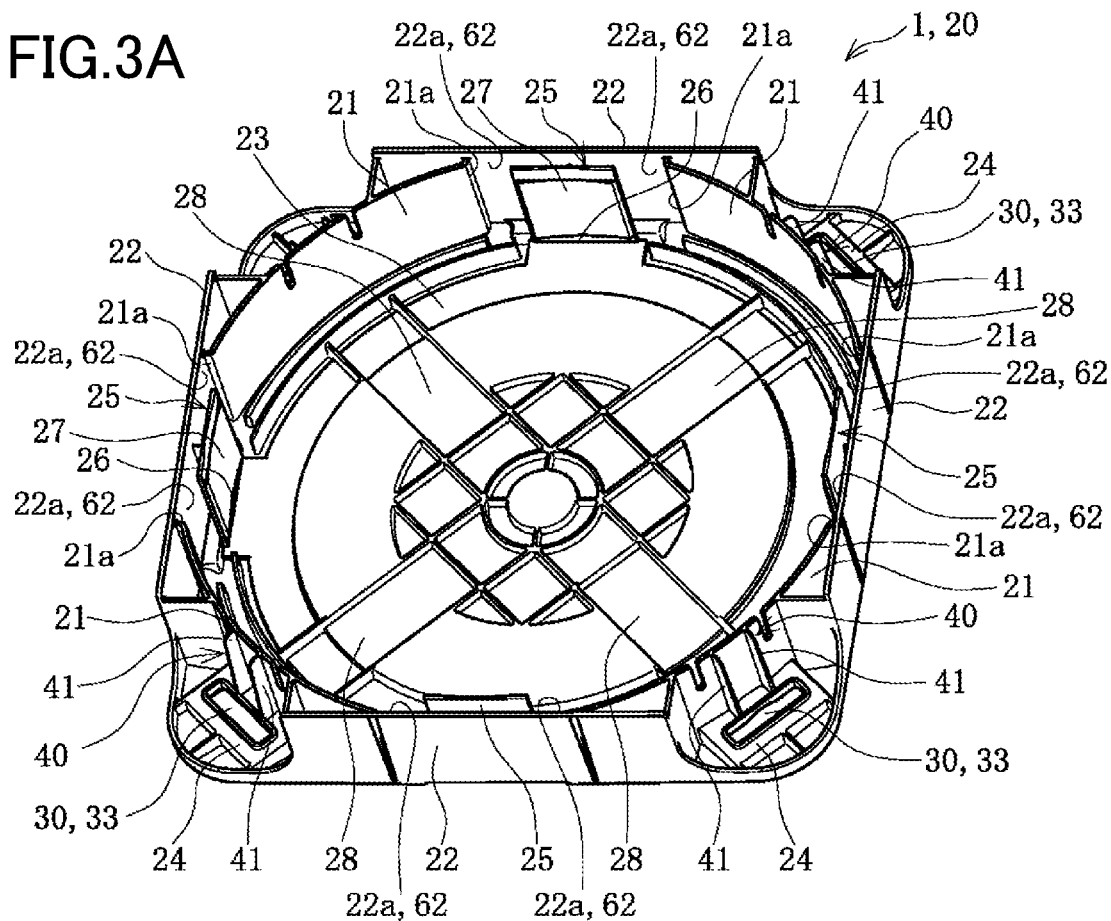
FIG. 3A is a schematic perspective view of a state in which a cover of an embodiment of the present disclosure is vertically reversed.
FIG. 3B is a partially enlarged perspective view of the right center in FIG. 3A.

The cover 20 is placed over the opening 11 of the container body 10 to close the opening 11. The container 1 for transporting a wafer includes retention mechanisms 30 that openably and closably mate the container body 10 and the cover 20 with each other and retain the container body 10 and the cover 20, as illustrated in FIG. 1A, FIG. 3A, and the like.

Figure 4:
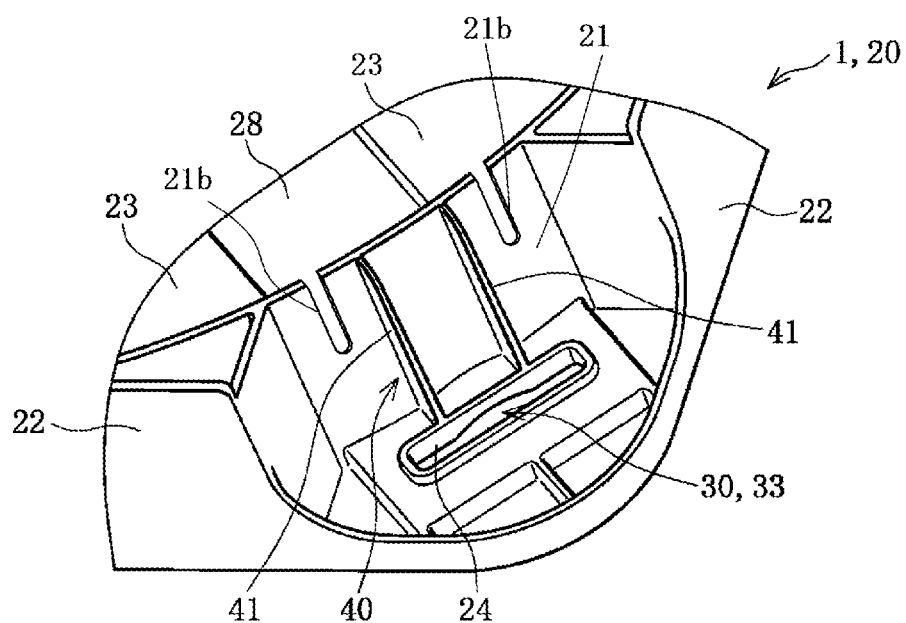
FIG. 4 is a partially enlarged perspective view of a corner illustrated in FIG. 3A according to an embodiment of the present disclosure.

The retention mechanisms 30 includes, in at least two places, locking members 32 including locking detent projections 31 disposed on the container body 10, and locking holes 33 that are disposed in the cover 20, and in which the locking detent projections 31 are locked. The container 1 for transporting a wafer includes four cover side walls 21 each having a shape in which a part of a cylinder is cut away at an angle. Guide members 40 are disposed on the cover side walls 21, respectively. Moreover, two notches 21b are formed on both sides of each of the guide members 40, as illustrated in FIG. 4.

The guide members 40 guides the cover 20 to keep a concentricity state between the container body 10 and the cover 20 while coming into contact with the locking members 32 when the cover 20 is mated with the container body 10. In other words, the guide members 40 guide the cover 20 so that the central axis of the container body 10 and the central axis of the cover 20 coincide with each other in a case in which the cover 20 is placed over the container body 10.

As a result, the cover 20 is guided to keep the concentricity state while the guide members 40 of the cover side walls 21 come into contact with the locking members 32 disposed on the container body 10 in at least two places when the placement of the cover 20 over the container body 10 is started. As a result, housed wafers W can be covered with the cover 20 without damaging the wafers W by the cover side walls 21 (see FIG. 6A, FIG. 6B, and the like).

In the present embodiment, a case, in which the opening 11 of the container body 10 is opened upward, and the wafers W are horizontally stacked and housed on the mounter 12, are described as an example. After the completion of the housing in which the wafers W are stacked and housed in the container 1 for transporting a wafer and the placement of the cover 20 is performed, the transportation and the like of the wafers W may be performed in any state (the orientations of the wafers W are, for example, horizontal or perpendicular orientations, and the like).

The container body 10 includes the mounter 12 that is a bottom surface. As illustrated in FIG. 1A, the mounter 12 has a quadrangular shape that is a generally square shape, and the four corners of the mounter 12 are formed in arc shapes. The wafers W are stacked and housed on the upper surface of the mounter 12. The external shape of the mounter 12 is not limited to a generally square shape, but may be another shape.

The mounter 12 is formed so that body side walls 14 that section a housing 13 for the wafers W are disposed upright to protrude upward. The body side walls 14 are formed to have a plurality of, for example, four arc shapes that are parts of a cylindrical shape to fit the shapes of the wafers W. The body side walls 14 are formed integrally with the mounter 12 so as to be at spacings D along a circumference to have a generally cylindrical shape. As a result, the upper ends of the body side walls 14 form the opening 11 of the container body 10, and a generally cylindrically shaped space that is sectioned by the body side walls 14 forms the housing 13 for the wafers W.

The inner diameter of the generally cylindrical shape of each of the body side walls 14 is formed to be a size that does not constitute a hindrance to housing or taking out of the wafers W. The size (diameter) of the housing 13 is set at a greater size (for example, a diameter of around 1 to 2 mm) than the size of each of the wafers W, such as, for example, 5 inches, 6 inches, 8 inches, or 12 inches. The body side walls 14 are disposed, at four places at the spacings D, for example, equal spacings, between the body side walls 14, and the spacings D become insertion openings for a robot arm in the case of takeout of the wafers W.

The body side walls 14 include auxiliary walls 14a that are folded toward a back surface on both arc-shaped edges and disposed upright on the mounter 12, as illustrated in FIGS. 1A and 1B, FIGS. 7A and 7B, and the like. The auxiliary walls 14a are formed in an L-shape on two planar wall surfaces contiguous to the edges of the body side walls 14. The arc-shaped body side walls 14 and the L-shaped auxiliary walls 14a are formed in a generally U-shape. The auxiliary walls 14a are formed of wall surfaces 14b and wall surfaces 14c. The wall surfaces 14b are parallel to central lines passing through the center between the spacings D of the arc-shaped body side walls 14. The wall surfaces 14c are parallel to the external shape of the container body 10, folded to be orthogonal to the wall surfaces 14b.

In the auxiliary walls 14a facing each other across the spacings D between the body side walls 14, the wall surfaces 14b face each other in parallel. Moreover, the wall surfaces 14c of the auxiliary walls 14a facing each other are placed on a straight line parallel to the external shape of the container body 10.

The auxiliary walls 14a function as reinforcement walls that prevent shrinkage deformation in which the edges of the body side walls 14 lean toward an inner side (central side) in the case of cooling after resin molding. The auxiliary walls 14a prevent the deformation in cooperation with ribs 14d in four places on each of the back surfaces of the body side walls 14. In particular, the auxiliary walls 14a are formed in an L-shape including the wall surfaces 14c parallel to the external shape as well as the wall surfaces 14b that function like the ribs 14d orthogonal to the back surfaces of the body side walls 14. As a result, the body side walls 14 are reinforced by the wall surfaces 14b in a radial direction corresponding to the ribs 14d and the wall surfaces 14c in a generally tangential direction orthogonal to the wall surfaces 14b. Accordingly, the shrinkage deformation of the edges of the auxiliary walls 14a is prevented, and the leaning toward the inner side can be still more reliably prevented. Moreover, the auxiliary walls 14a function not only as the guide members 40 but also guides 60 in a concentricity state. Details thereof are described later together with the guide members 40.

The container body 10 is formed on the outer peripheries of the lower ends of the body side walls 14 so that arc-shaped mating surfaces 15 mating with the cover 20 (see FIG. 3A) protrude upward, as illustrated in FIGS. 1A and 1B, FIGS. 2A and 2B, and the like. Linear-shaped mating surfaces 16 are formed via uneven portions in portions of the four spacings D of each of the body side walls 14 of the outer periphery of the mounter 12. The linear-shaped mating surfaces 16 and the arc-shaped mating surfaces 15 surround the housing 13 in an approximately ring shape. Each of three of the four linear-shaped mating surfaces 16 is divided into two portions by a depression formed in a center. Moreover, surfaces 16a contiguous to the linear-shaped mating surfaces 16 are formed in a direction in which the linear-shaped mating surfaces 16 extend. The linear-shaped mating surfaces 16 and the surfaces 16a are approximately circled in the slightly inner side of the external shape of the container body 10.

When the cover 20 is placed over the container body 10, the inner side surfaces of the cover side walls 21, divided into the four portions, of the cover 20 come into contact with the arc-shaped mating surfaces 15 of the container body 10. Simultaneously, cover outer walls 22 on the four sides of the linear of cover 20 come into contact with the linear-shaped mating surfaces 16 of the container body 10. The concentricity state of the container body 10 and the cover 20 in the stage of the end of the placement can be kept by the mating between the cover side walls 21 and the arc-shaped mating surfaces 15, and the mating between the cover outer walls 22 and the linear-shaped mating surfaces 16.

Figure 5A:
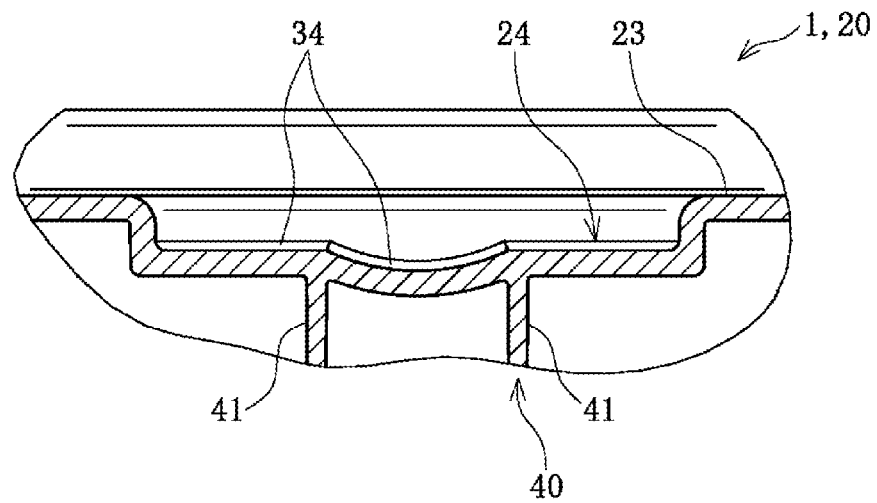
FIG. 5A is a front view of a locking hole of a cover of an embodiment of the present disclosure.
Figure 5B:
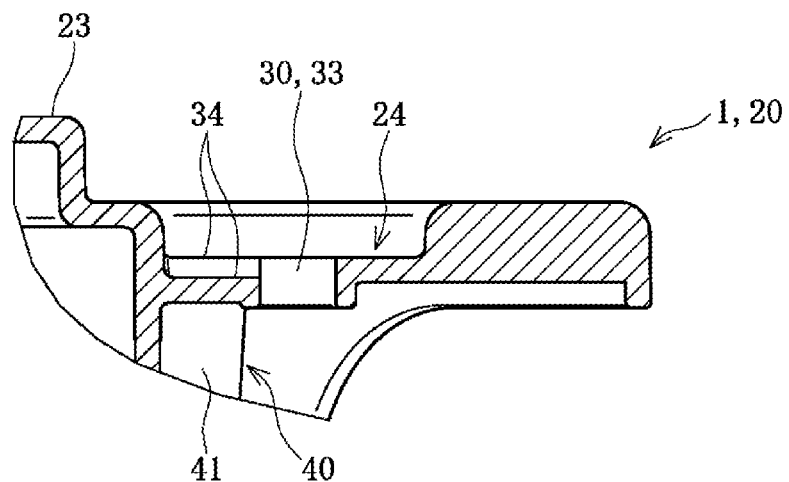
FIG. 5B is a cross sectional view of the center of the locking hole of the cover of the embodiment of the present disclosure.

The cover 20 is placed over the opening 11 of the container body 10 (see FIG. 1A) to close the opening 11, as illustrated in FIGS. 3A and 3B, and FIG. 4, in which the cover is vertically reversed, and FIGS. 5A and 5B, in which the cover is in a normal state. The external shape of the cover 20 is allowed to be a shape in which the four corners of a generally square shape that is the same shape as the shape of the mounter 12 have arc shapes. The cover 20 includes a cover top panel 23 that closes a top panel. The cover side walls 21 divided into the four portions corresponding to the body side walls 14 of the container body 10 are formed in the four corners of the cover top panel portion 23 in an arc shaped so that the cover side walls protrude downward. The cover outer walls 22 are formed in the cover 20 to protrude downward in outer sides between the arc-shaped cover side walls 21. Both ends of each of the cover outer walls 22 are linked to the cover side walls 21 in the outer sides of the cover side walls 21. As a result, the cover side walls 21 and the cover outer walls 22 are linked on the entire periphery of the cover 20.

When the cover 20 is placed over the container body 10, the inner side surfaces of the four cover side walls 21 of the cover 20 come into contact with the arc-shaped mating surfaces 15 of the container body 10, as already described. At the same time, the inner side surfaces of the linear-shaped cover outer walls 22 of the cover 20 come into contact with the linear-shaped mating surfaces 16 of the container body 10. As a result, the container body 10 and the cover 20 are mated with each other to surround the housing 13.

As described above, each of the retention mechanisms 30 includes the locking members 32 formed on the container body 10 and the locking holes 33 formed in the cover 20 in at least two places.

Figure 2A:
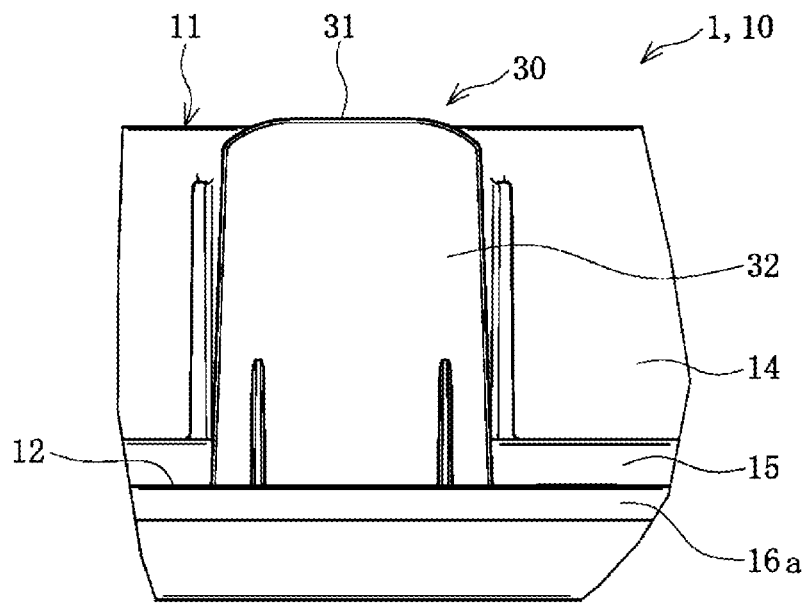
FIG. 2A is a rear view of a locking member of an embodiment of the present disclosure.
Figure 2B:
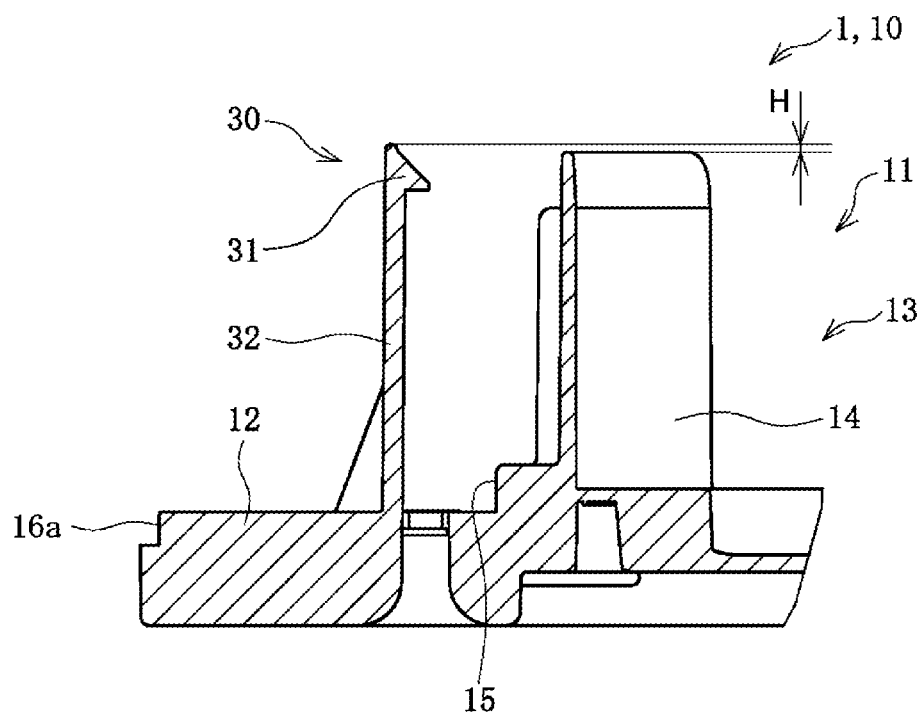
FIG. 2B is a cross sectional view of the locking member of the embodiment of the present disclosure.

In the container body 10, the locking members 32 are formed in the four places of the outer side of each of the body side walls 14, at the four corners of the mounter 12, as illustrated in FIGS. 1A, 2A, and 2B. The locking members 32 are formed integrally with the mounter 12 and to protrude upward (toward the opening 11 of the one end) from the mounter 12. In other words, the locking members 32 are formed to extend from the other end to one end of the container body 10 described above. The locking members 32 include the locking detent projections 31 in the one end. Each of the locking members 32 has such a length that the locking detent projections 31 do not protrude from the top of the cover 20 when the cover 20 is placed over the container body 10. Moreover, the leading ends of the locking detent projections 31 are slightly higher than the top of the opening 11. In FIG. 2B, the leading end of each of the locking detent projections 31 is higher than the top of the opening 11 by an optional difference H between the heights.

In the cover 20, the locking holes 33 are formed in the four places corresponding to the positions of the locking members 32 of the container body 10, at the four corners of the cover top panel 23, as illustrated in FIGS. 3A and 4.

The locking holes 33 are formed in recesses 24 formed on the top surface of the cover top panel 23, as illustrated in FIG. 5B. The centers of the locking surfaces 34 of the locking holes 33, on which the locking detent projections 31 are locked, are dented in the case of releasing a locking state, to facilitate pressing back of the locking detent projections 31.

When the cover 20 is placed over the container body 10, the locking detent projections 31 closer to the container body 10 get over the locking holes 33 closer to the cover 20. Then, the lower end horizontal surfaces of the locking detent projections 31 are locked on the locking surfaces 34. In such a locking state, the container body 10 and the cover 20 are mated with each other to keep the concentricity state.

The locked retaining state can be reliably and easily released by pressing the locking members 32 back from the central side to the outer side using the recesses of the centers of the locking surfaces 34 of the cover 20.

The retention mechanisms 30 are preferably disposed in at least two places, for example, in two places at diagonal positions, and preferably enable the container body 10 and the cover 20 to be retained in a locking state.

The cover 20 includes pressing members 25 in at least two places, for example, four places corresponding to the spacings D between the body side walls 14 of the container body 10, in the outer sides of the wafers W, as illustrated in FIGS. 3A, 3B, 7A, and 7B. The pressing members 25 are flat-plate-shaped members that are put on the outer sides of the wafers W to press the wafers W.

The pressing members 25 protrude downward (toward a side opposite to the opening 11) from the inner side of the cover top panel 23 as a top panel, and are placed between the two adjacent cover side walls 21. The pressing members 25 are formed so that the pressing members 25 can swing about swing shafts 26 on a base end.

Each of the pressing members 25 includes an outer surface that has a planar shape, and an inner surface that has a circumference shape. Accordingly, both ends in the width direction of each of the pressing members 25 are thick walls 25a that are thicker than the center. In contrast, the inner surface of each of the swing shafts 26 is formed in a planar shape matching the board thickness of the center. Accordingly, the swing shafts 26 are thinner than the pressing members 25. As a result, each of the swing shafts 26 has a hinge structure in which the swinging of the pressing members 25 about the swing shafts 26 is facilitated. The positions of the swing shafts 26 are set so that the inner side surfaces (surfaces closer to the center of each of the wafers W) of the pressing members 25 are at positions matching the outer diameter of each of the stacked and housed wafers W. Moreover, each of the inner surfaces of the leading ends of the pressing members 25 has a planar or tapered planar shape to be suitable for coming into contact with vertical surfaces 17b in the guiding grooves 17 of the container body 10.

Pressing face bars 27 that press the outer peripheries of the wafers W on the basis of a face are disposed on the inner side surfaces of the pressing members 25, and, for example, formed integrally with the pressing members 25. The pressing face bars 27 may be formed of a body or material different from the pressing members 25, and attached. Accordingly, the pressing face bars 27 may preferably reliably press the outer peripheries of the wafers W on the basis of a face.

Figure 1B:
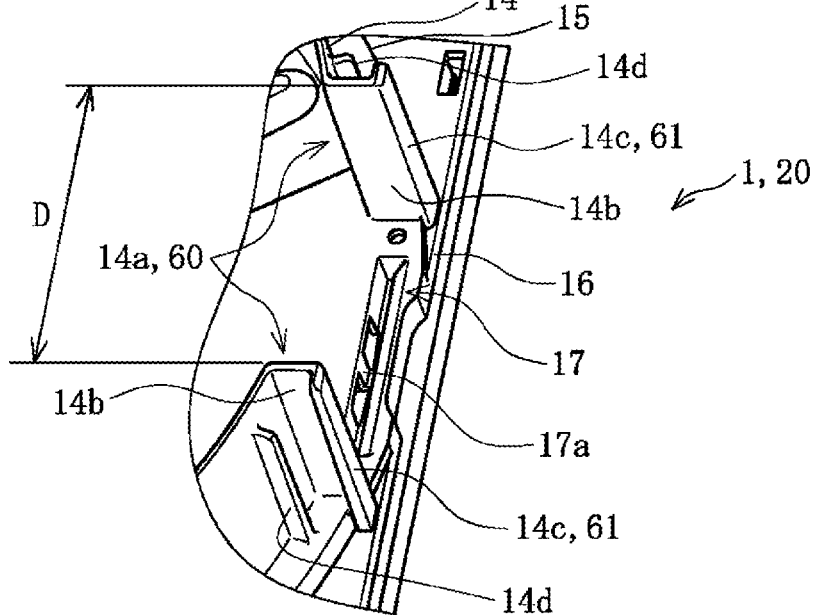
FIG. 1B is a partially enlarged perspective view of the right center in FIG. 1A.
Figure 7A:
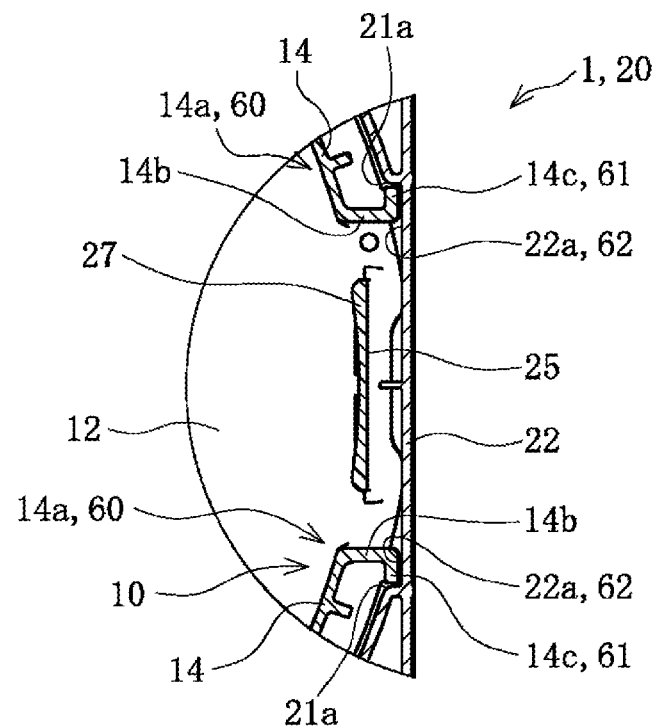
FIG. 7A is a partial horizontal cross sectional view in operation of a pressing member of an embodiment of the present disclosure.
Figure 7B:
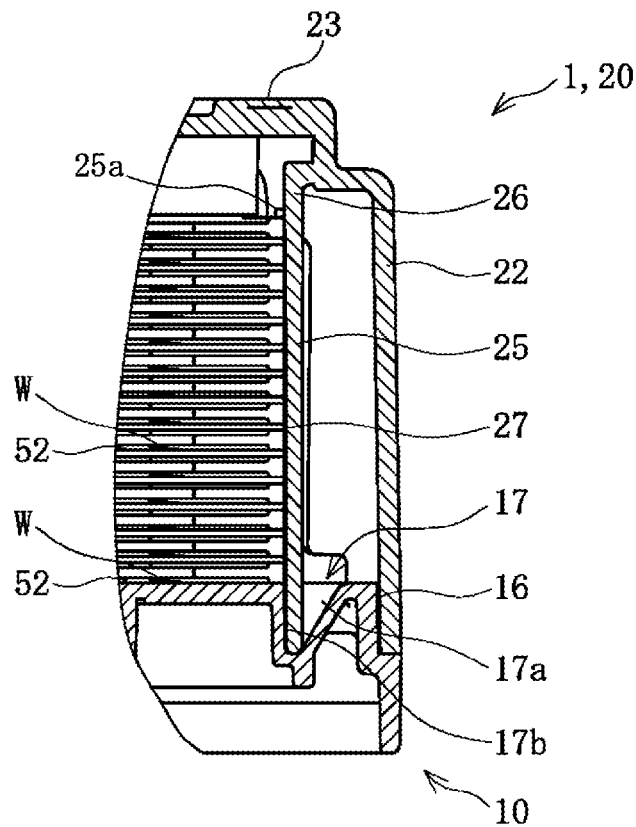
FIG. 7B is a partial vertical cross sectional view in the operation of the pressing member of the embodiment of the present disclosure.
Figure 8A:
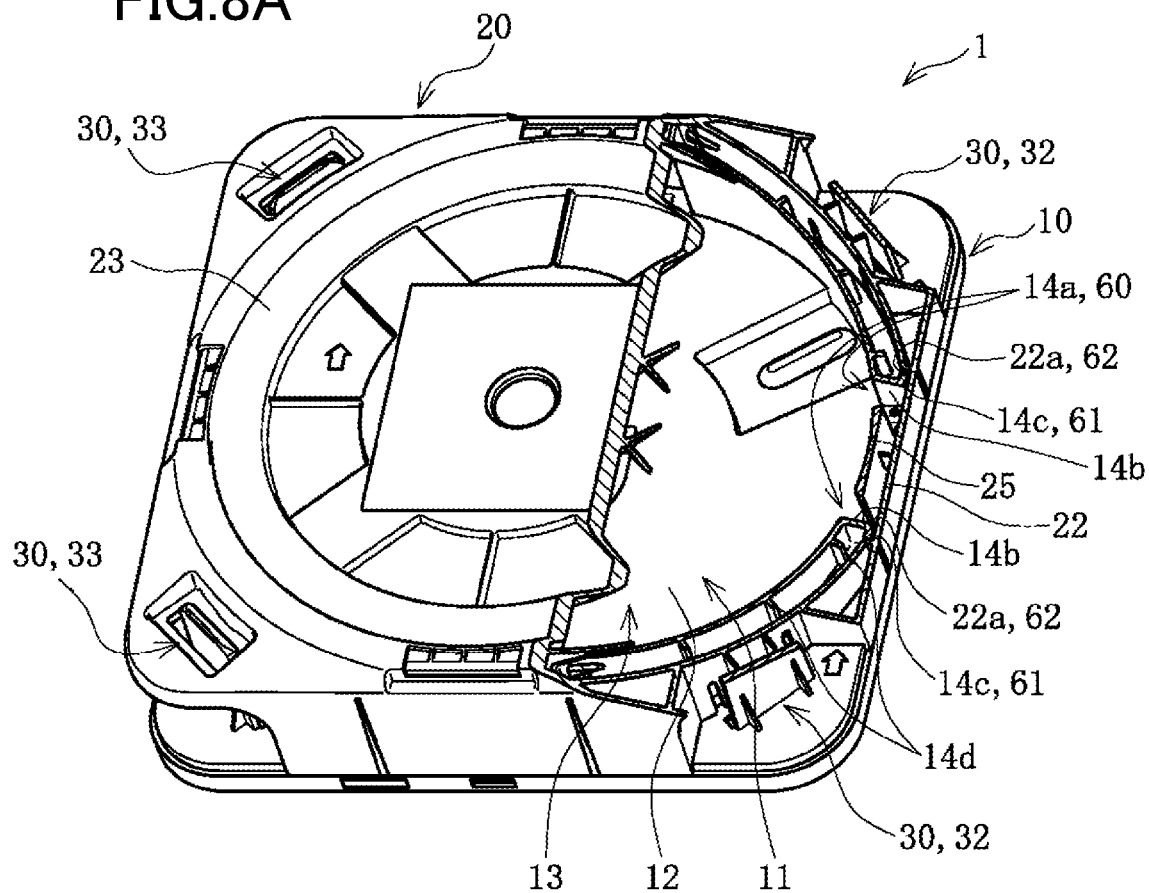
FIG. 8A is a schematic perspective view of a cover, of which a part is cut away, according to an embodiment of the present disclosure.
Figure 8B:
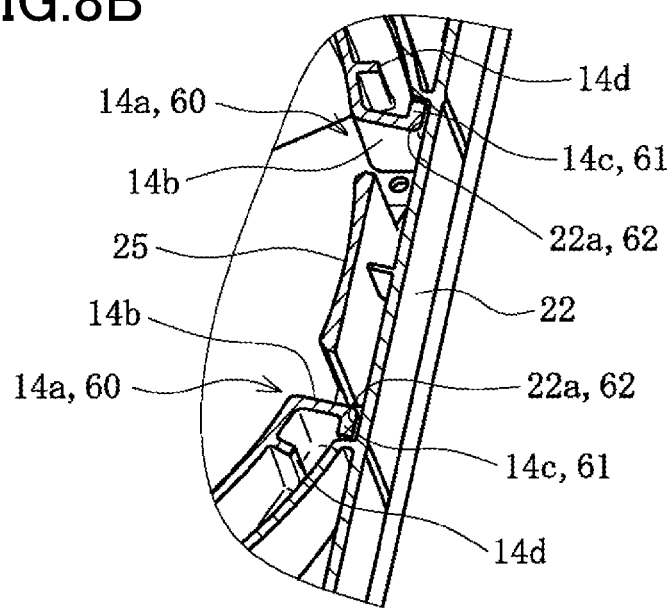
FIG. 8B is a partially enlarged perspective view of a right center in FIG. 8A.

The container body 10 includes the guiding grooves 17 for guiding the pressing members 25 to positions at which the outer peripheries of the wafers W are pressed, as illustrated in FIGS. 1A, 1B, and 7B. The guiding grooves 17 are formed in the four places of the spacings D between the body side walls 14 of the mounter 12. The guiding grooves 17 allow the pressing members 25 disposed on the cover top panel 23 of the cover 20 to be swung by the swing shafts 26 in the base end. As a result, the guiding grooves 17 allow the leading ends of the pressing members 25 to be guided to be moved from the outer side to the inner side (center side) of the mounter 12.

The guiding grooves 17 are formed in a linear shape in parallel to the respective sides of the quadrangular shape of the mounter 12 as a bottom surface. Each of the guiding grooves 17 is formed in a cross-sectional shape having a generally V-shape, recessed below the surface of the mounter 12. Each of the guiding grooves 17 includes: a sloped surface 17a in which the outer side of the container body 10 is higher and the central side of the container body 10 is lower; and the vertical surface 17b contiguous to the central side of the sloped surface 17a.

In the container body 10, recesses and projections, ribs, or the like are formed on another member as needed, in addition to the mounter 12 and the ribs 14d of the body side wall 14, as illustrated in FIGS. 1A, 1B, 2A, and 2B. The recesses and projections, the ribs, or the like allow reinforcement, improvement in rigid, and the like for handling and the like in another step.

The guiding grooves 17 allow the pressing members 25 to be guided, and therefore, the projection length of each of the pressing members 25 is set as described below. More specifically, in each process in which the cover 20 is placed over the container body 10, the projection length of each of the pressing members 25 is set as described below. FIG. 7B illustrates the state of a completion period in which the cover 20 is completely placed over the container body 10. In the early stage of the end of the placement, the leading ends (lower ends) of the pressing members 25 of the cover 20 are located in the guiding grooves 17 of the container body 10. Subsequently, the pressing members 25 are guided in the guiding grooves 17 along the sloped surfaces 17a while the placement of the cover 20. Then, in the completion period in which the complete placement has been achieved (see FIG. 7B), a state is accomplished in which the inner side surfaces of the pressing members 25 come into contact with the vertical surfaces 17b of the guiding grooves 17.

In other words, the state in which the cover 20 is placed over the container body 10 and is locked is a state in which the leading ends of the pressing members 25 are located at the bottoms of the guiding grooves 17, and prevented from returning to the outer sides due to the sloped surfaces 17a.

As described above, the pressing members 25 at the four places are retained at positions corresponding to the outer diameter of each of the wafers W in the state in which the cover 20 is placed over the container body 10 and is locked. As a result, the pressing face bars 27 of the pressing member members 25 at the four places can press the outer peripheries of the stacked wafers W on the basis of a surface, and therefore, the wafers W can be reliably prevented from horizontally moving.

The pressing members 25 are located between the cover top panel 23 as the top panel of the cover 20 and the guiding grooves 17 formed by recessing the mounter 12, as the bottom surfaces of the container body 10. As a result, the outer peripheries of all the wafers W stacked on the mounter 12 can be pressed on the basis of a surface, and even the wafer W at the bottom stage can be reliably pressed.

Moreover, the pressing members 25 do not exist on the container body 10 from which the cover 20 is removed. As a result, the housing of the wafers W in the container body 10 can be performed in a conventional manner in a state in which the spacings D between the body side walls 14 are opened, while preventing the housing from being hindered by the pressing members 25.

As illustrated in FIGS. 3A to 5B, recesses and projections, ribs, or the like are formed on members such as the cover side walls 21, cover outer walls 22, and cover top panel 23 of the cover 20, as needed. The recesses and projections, the ribs, or the like allow reinforcement or improvement in rigid for handling and the like in another step.

Moreover, upper pressers 28 for vertically pressing the wafers W housed on the mounter 12 of the container body 10 are formed integrally with the cover top panel 23. The upper pressers 28 vertically press the stacked wafers W between the upper pressers 28 and the mounter 12 in a manner similar to a conventional manner.

In the container 1 for transporting a wafer, guide members 40 are disposed in at least two places, as illustrated in FIGS. 3A and 4. The guide members 40 prevent the wafers W housed in the housing 13 from being damaged when the cover 20 is placed over the container body 10. The guide members 40 guide the cover 20 in a kept concentricity state in which the central axis of the container body 10 and the central axis of the cover 20 coincide with each other. In the illustrated example, the guide members 40 are disposed in four places at the four corners of the cover 20.

Figure 6A:
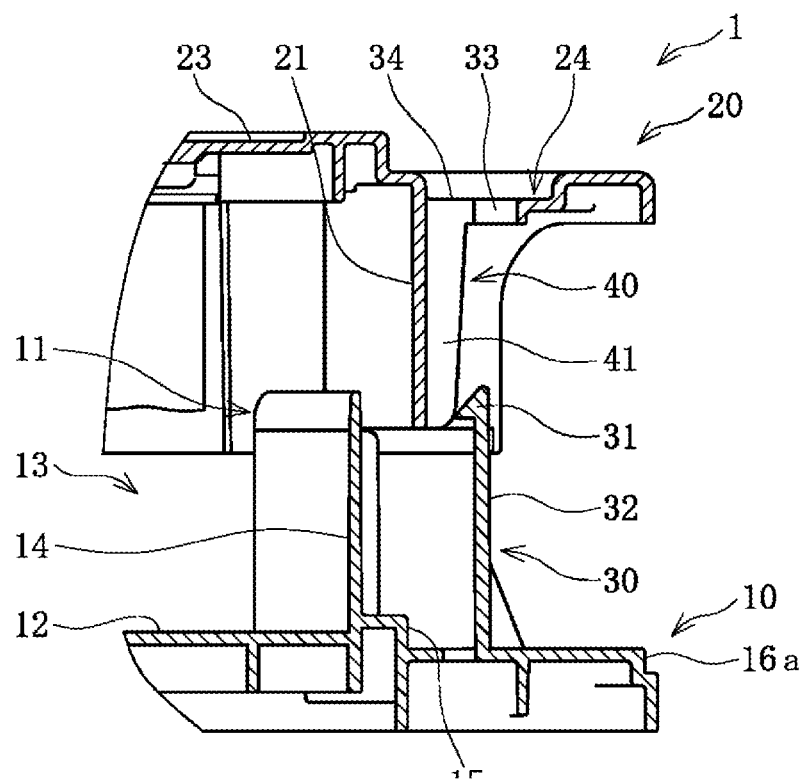
FIG. 6A is an explanatory diagram of a state of start of guide in operation of a guide member of an embodiment of the present disclosure.

The guide members 40 guide the container body 10 and the cover 20 in a kept concentricity state while coming into contact with the locking members 32 at four places disposed on the container body 10 (see FIGS. 3A and 6A, and the like). Each guide member 40 includes rib-shaped guiders 41. With regard to the guiders 41, for example, two guiders 41 are formed in parallel to be spaced from the outer sides of the cover side walls 21 and to protrude outward. Each of the guiders 41 has a sloped surface in which the protrusion length, closer to the opening (closer to the upper end, in the illustrated example in the reverse state), of the leading end is short, and the protrusion length, closer to the cover top panel 23, of the base end is long. Each of the guiders 41 has a guide surface formed from the opening side of the leading end to the locking holes 33 of the recesses 24 of the cover top panel 23 of the base end. The guiders 41 of the cover 20 and the sloped surfaces (having higher outer sides and lower central sides) of the upper ends of the locking detent projections 31 of the container body 10 come into contact with each other to keep a concentricity state.

As a result, the locking detent projections 31 of the locking members 32 of the container body 10 and the guiders 41 of the guide members 40 of the cover 20 come into contact with each other during a period between the start of the placement of the cover 20 and the end of the placement. As a result, the container body 10 and the cover 20 are guided until the cover 20 is retained by the retention mechanisms 30, while keeping the concentricity state. Moreover, the sloped surface of each of the guiders 41 includes the lower side closer to the opening and the higher side closer to the cover top panel portion 23, and therefore, a mold removal property from a mold in molding can be improved.

In the container 1 for transporting a wafer, the cover 20 includes two rib-shaped guiders 41 included in each of the guide members 40. As a result, the leading ends of the two guiders 41 hit the top surfaces of the locking detent projections 31 of the locking members 32 of the container body 10 in each of four places when the placement of the cover 20 over the container body 10 is started.

In this state, the placement of the cover 20 is performed to press the cover 20 while bringing the sloped surfaces of the guiders 41 and the sloped surfaces of the locking detent projections 31 into contact with each other. Then, the deviation of the central axis of the cover 20 from the container body 10 is modified by the sloped surfaces of the guiders 41 and the locking detent projections 31, and a concentricity state is achieved.

The cover 20 is being placed over the container body 10 in the concentricity state by further pressing the guiders 41 of the cover 20 at the four places and the locking detent projections 31 of the locking members 32 at the four places while bringing the guiders 41 and the locking detent projections 31 into contact with each other. When the placement is finished, the locking detent projections 31 are locked in the locking holes 33 of the cover 20, the cover 20 and the container body 10 are mated with each other in a concentricity state, and a retention state is achieved by the retention mechanisms 30.

In the container 1 for transporting a wafer, the two guiders 41 are formed on the outside of each of the cover side walls 21 for each guide member 40; however, each guide member 40 may be formed of one guider 41 of which the width is increased.

Moreover, the guide members 40 may be formed so that the cover side wall 21 between the two guiders 41 is removed, the wall surface is allowed to be contiguous to the leading end sides of the guiders 41, the guiders 41 have a lateral square-U-shaped cross section, and the guide members 40 protrude outward from the cover side walls 21. In other words, the guide members 40 preferably enable the placement of the cover 20 in a concentricity state in contact with the locking members 32 of the container body 10.

In the container 1 for transporting a wafer, the concentricity state is secured when the cover 20 is placed over the container body 10. Accordingly, the cover side walls 21 of the cover 20 are prevented from hitting and damaging the wafers W housed in the container body 10.

Moreover, in the container 1 for transporting a wafer, the locking members 32 are allowed to be higher than the body side walls 14 of the container body 10 in a case in which the cover 20 is placed over the container body 10. Accordingly, first, the guiders 41 of the guide members 40 hit the locking detent projections 31 of the locking members 32. As a result, the wafers W in the housing 13 can be still more reliably prevented from being damaged from the start of the placement of the cover 20.

The cover 20 is provided with the pressing members 25 that press the outer side of the wafers W on the basis of a surface. The pressing members 25 are guided from a state in which the pressing members 25 are opened outward to a state in which the pressing members 25 are closed at predetermined positions by the guiding grooves 17. The guided pressing members 25 can reliably press the wafers W to keep the concentricity state of the container body 10 and the cover 20.

Moreover, the structure described above can prevent the damage of the wafers W due to the pressing members 25. As a result, in the container 1 for transporting a wafer, the central axes of the container body 10 and the cover 20 do not deviate from each other even in the case of manual placement of the cover 20 by an operator without using an automated apparatus such as a robot arm. Accordingly, the concentricity state of the container body 10 and the cover 20 can be reliably kept in accordance with the present embodiment.

In the container 1 for transporting a wafer, the auxiliary walls 14a of both edges of each of the body side walls 14 of the container body 10 further serve as the guides 60, as illustrated in FIGS. 1A, 1B, 7A, 8A, and 8B. The guide 60 is allowed to be a guide in a case in which the auxiliary walls 14a are first guide elements 61, the cover 20 is provided with second guide elements 62, and the cover 20 is placed over the container body 10.

In the container body 10, the wall surfaces 14c that face each other across the spacings D between the auxiliary walls 14a and are generally parallel to the radial external shape are included in the first guide elements 61. In other words, the guide elements 61 use the L-shaped wall surfaces 14c and the opened edges of the wall surfaces 14c.

In the cover 20, the linked wall surfaces 21a of the divided arc-shaped cover side walls 21 and the inner wall surfaces 22a of the cover outer wall portions 22 are included in the second guide elements 62, as illustrated in FIGS. 3A and 3B. The linked wall surfaces 21a are generally parallel to a radial direction in which the edges of the divided arc-shaped cover side walls 21 and the cover outer walls 22 are linked to each other. A spacing between the two linked wall surfaces 21a, adjacently facing each other, of the guide elements 62 is set to allow the mating while allowing the contact in correspondence with the spacing D between the wall surfaces 14c of the auxiliary walls 14a of the guide elements 61. Moreover, the width of each of the wall surfaces 14b is set, and the positions of the wall surfaces 14b from the external shape are adjusted so that the inner wall surfaces 22a of the guide elements 62 can mate, while coming into contact in a concentricity state, with the wall surfaces 14c parallel to the external shape of the container body 10.

In addition, pairs of the two first guide elements 61 of the container body 10, included in the guides 60, and pairs of the two second guide elements 62 of the cover 20 are disposed at four places. Accordingly, the eight guide elements 61 and the eight guide elements 62 in total are disposed. The positions and the like of the eight guide elements 61 and the eight guide elements 62 in total are set so that the concentricity state in which the central axes of the container body 10 and the cover 20 coincide with each other can be kept.

The guiders 41 of the guide members 40 and the locking detent projections 31 of the locking members 32, placed at the four corners of the container 1 for transporting a wafer, allow guiding in which the concentricity state of the container body 10 and the cover 20 is regulated in diagonal directions orthogonal to each other. In addition, the guides 60 also enable the guiding in a direction (two directions orthogonal to each other) along each side in the center of each side. The concentricity state of the container body 10 and the cover 20 can be still more reliably kept due to the inclusion of the guides 60. As a result, the container 1 for transporting a wafer can prevent the housed wafers W from being damaged due to the contact of the cover side walls 21 of the cover 20 with the housed wafers W, and enables smooth placement of the cover 20.

Moreover, the auxiliary walls 14a prevent both edges of each of the body side walls 14 of the container body 10 from leaning inward. The inclusion of the auxiliary walls 14a can also prevent the body side walls 14 from coming into contact with the wafers W due to the leaning of the body side walls 14, can prevent the wafers W from being damaged, and can house and transport the wafers W.

In the container 1 for transporting a wafer, the container body 10 and the cover 20 are preferably formed of a conductive plastic. Examples of the conductive plastic include: plastic to which a conductive filler is added; or plastic treated with a polymer alloy. Examples of the conductive filler include carbon black, graphite carbon, graphite, carbon fibers, metallic powders, metal fibers, powders of metal oxides, inorganic fine powders coated with metals, and organic fine powders or fibers.

Figure 9:
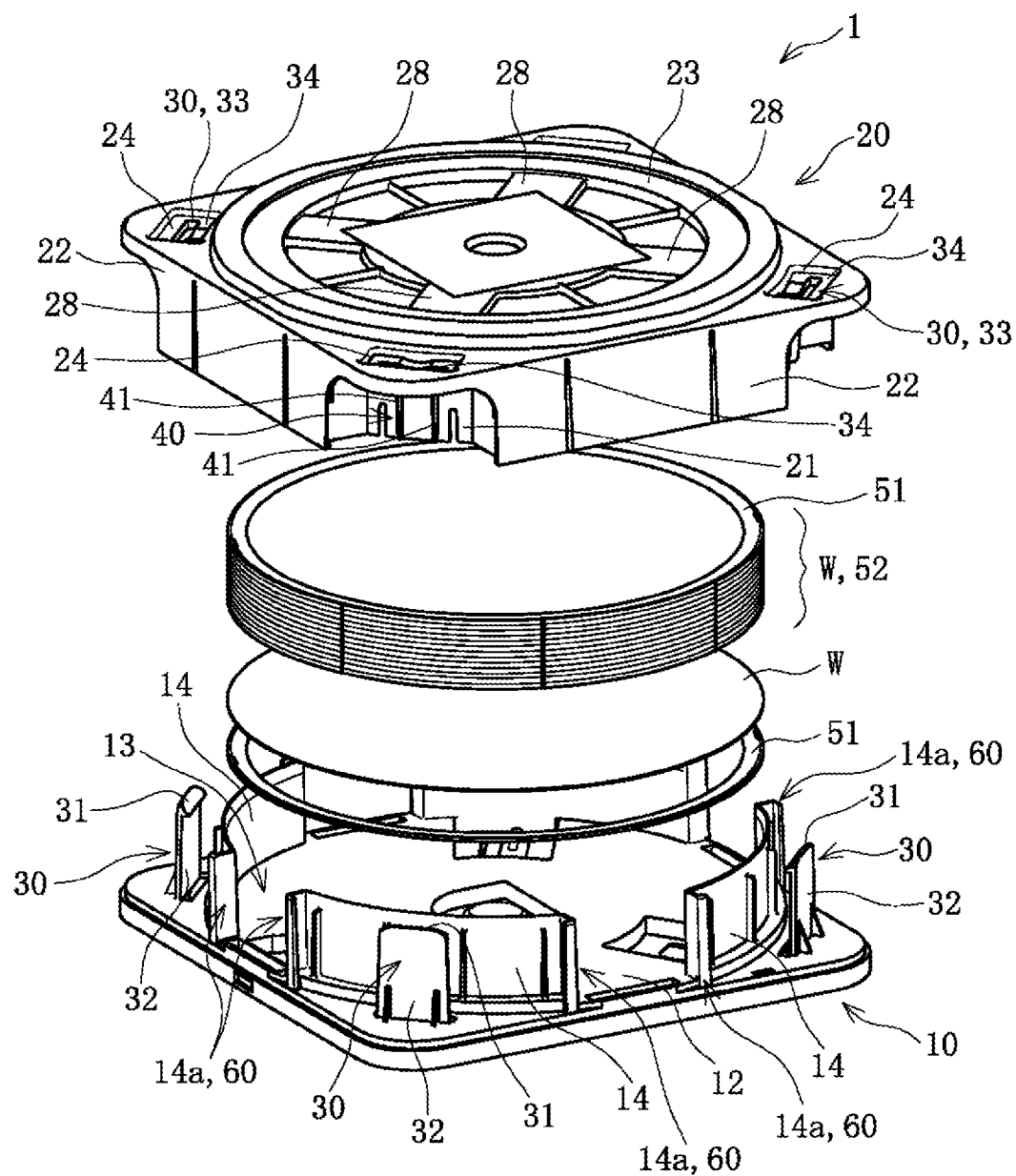
FIG. 9 is a schematic perspective view of a state, in which parts are removed, in an embodiment of the present disclosure.

In such a container 1 for transporting a wafer, a ring spacer 51 as a cushioning material in a bottom stage is placed on the housing 13 on the mounter 12 surrounded by the four body side walls 14 of the container body 10, as illustrated in FIG. 9. The wafers W and interlayer sheets 52 are alternately stacked thereon, and a ring spacer 51 as a cushioning material is placed in a top stage, and housed. In a case in which the wafers W are housed in the housing 13, both the edges of the body side walls 14 are prevented from leaning inward, whereby the wafers W are prevented from being damaged due to the contact of the body side walls 14 with the wafers W, and the wafers W can be housed.

The wafers W of which the number is predetermined are stacked and housed in the container body 10, and then the placement of the cover 20 over the container body 10 is started. When the placement of the cover 20 over the container body 10 is started, in the four places (four corners) of the container 1 for transporting a wafer, the leading ends of the two guiders 41 in each place hit the top surface of each locking detent projection 31 of the locking members 32 of the container body 10, as illustrated in FIG. 6A.

When the placement of the cover 20 is performed to press the cover 20 while bringing the sloped surfaces into contact with each other in such a state, the deviation of the central axis of the cover 20 from the container body 10 is modified by each of the sloped surfaces of the guiders 41 and the locking detent projections 31, and the concentricity state is achieved. The deviation of the central axis of the cover 20 from the container body 10 is also modified by the guide elements 61 and guide elements 62 of the guides 60, and the concentricity state is achieved. As a result, the guiding is also performed in diagonal directions orthogonal to each other, and lateral and longitudinal directions orthogonal to each other, and the concentricity state is kept.

Figure 6B:
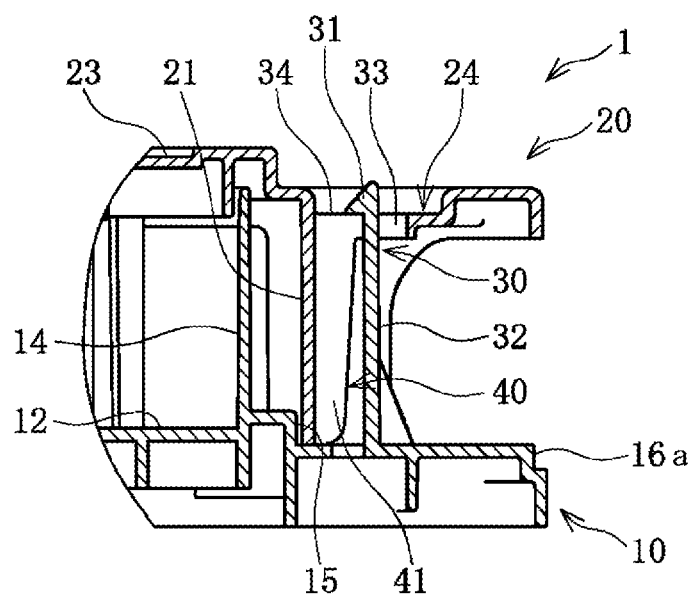
FIG. 6B is an explanatory diagram after completion of the guide in the operation of the guide member of the embodiment of the present disclosure.

When the guiders 41 of the cover 20 in the four places and the interior surfaces of the locking members 32 and the locking detent projections 31 in the four places are further pressed while being brought into contact with each other, the cover 20 is being placed over the container body 10 in the concentricity state of the container body 10 and the cover 20. When the placement is finished, the locking detent projections 31 are locked in the locking holes 33 of the cover 20, as illustrated in FIG. 6B. As a result, the concentricity state of the cover 20 and the container body 10 is kept.

When the cover 20 is placed over the container body 10 until a state in which the leading ends of the cover outer wall portions 22 of the cover 20 come into contact with the linear-shaped mating surfaces 16, a state is achieved in which the leading ends of the pressing members 25 of the cover 20 are located above the guiding grooves 17 of the container body 10.

When the cover 20 is further placed over the container body 10, the leading ends of the pressing members 25 are guided, and moved from the outer side to the central side by the sloped surfaces 17a of the guiding grooves 17 of the container body 10. In such a case, the pressing members 25 swing about the swing shafts 26 of the base end.

A state in which the cover 20 is completely placed over the container body 10 results in a state in which the pressing members 25 come into contact with the vertical surfaces 17b in the central sides of the guiding grooves 17, as illustrated in FIG. 7B. In such a case, the inner side surfaces of the pressing members 25 are at positions at which the inner side surfaces come into contact with the outer diameters of the wafers W. As a result, the pressing face bars 27 of the pressing members 25 in the four places press the outer peripheries of the stacked wafers W on the basis of a surface to prevent the wafers W from horizontally moving.

In such a container 1 for transporting a wafer, a concentricity state is achieved, without deviating the central axes of the container body 10 and the cover 20 from each other, by guide by the guide members 40 and guide by the guides 60, even in the case of the placement of the cover 20 in a state in which the wafers W are housed in the container body 10. Therefore, the cover side walls 21 or pressing members 25 of the cover 20 can be prevented from hitting and damaging the wafers W. Moreover, the stacked wafers W are pressed, and also inhibited from moving in a vertical direction, by the upper surface of the mounter 12 of the container body 10 and the upper pressers 28 of the cover top panel 23 of the cover 20.

In addition, the cover side walls 21 and cover outer walls 22 of the cover 20 come into contact with the arc-shaped mating surfaces 15 and linear-shaped mating surfaces 16 of the container body 10 in the state in which the cover 20 is completely placed over the container body 10. As a result, the container body 10 and the cover 20 are mated with each other to surround the housing 13.

The wafers W are stacked and housed in the container body 10, and the cover 20 is placed over the container body 10 in such a manner, and the wafers W housed in the housing 13 are then pressed in the vertical and lateral directions. Therefore, the wafers W are not moved even if the container 1 for transporting a wafer is transported in an optional direction. Accordingly, a problem such as breakage or dusting due to flaws, cracks, or the like, or chemical fouling on the wafers W, caused by rubbing of the wafers W with the interlayer sheets and the like directly coming into contact with the wafers W, can be prevented.

The container 1 for transporting a wafer according to the embodiment of the present disclosure is the container 1 for transporting a semiconductor wafer, including: the container body 10 of which the one end is provided with the opening 11 and the other end is provided with the mounter 12 that faces the opening 11 and on which the stacked wafers W are housed; and the cover 20 that closes the opening 11, wherein the container body 10 includes the plurality of arc-shaped body side walls 14 that sections the housing 13 that houses the wafers W disposed upright on the mounter 12; and the auxiliary walls 14a that are folded toward the back surface and disposed upright on both the edges of the body side walls 14.

In such a configuration, both the edges of the body side walls 14 disposed upright on the mounter 12 of the container body 10 can be prevented from leaning inward due to shrinkage deformation by the auxiliary walls 14a. Therefore, the wafers W can be prevented from coming into contact with the body side walls 14 and being damaged in the case of housing or taking out the wafers W housed in the housing 13.

In the container 1 for transporting a wafer according to the embodiment of the present disclosure, the auxiliary walls 14a of the container body 10 serve as the first guide elements 61. In the cover 20, the second guide elements 62 that are guided along the first guide elements 61 are formed.

In the container body 10, the auxiliary walls 14a of both the edges of the body side walls 14 serve as the first guide elements 61. In addition to the guide elements 61, the second guide elements 62 formed on the cover 20 can keep the concentricity state of the container body 10 and the cover 20, and enable the guiding. Therefore, the cover 20 can be prevented from coming into contact with the wafers W when the cover 20 is placed over the container body 10 or when the cover 20 is removed from the container body 10.

Accordingly, the guide elements 61 and the guide elements 62 can still more reliably prevent the wafers W from being damaged.

In the embodiment described above, a case in which the body side walls 14 are disposed in the four places is described as an example; however, the body side walls 14 are preferably disposed at least two places and the like at diagonal positions. In other words, it is preferable that the housing 13 can be sectioned, and the wafers W can be reliably housed. Moreover, the widths (lengths along the external shapes) of the wall surfaces 14c parallel to the external shapes of the auxiliary walls 14a disposed on both the bottom edges of the body side wall 14 are not particularly limited, and may be set as appropriate. For example, in the case of the guides 60, the widths preferably match the shape and dimension of the cover 20.

In the embodiment described above, a case in which the pressing members 25 are disposed in the four places is described as an example; however, the pressing members 25 are preferably disposed in at least two places at diagonal positions. For example, the wafers W can be reliably pressed by disposing the pressing members 25 in three or more places.

In the embodiment described, with regard to the pressing members 25, one flat-plate-shaped pressing member 25 is placed in one place. In addition, one pressing member 25 can also be formed to have a division structure, and each of a plurality of flat-plate-shaped pressing members can also be allowed to swing. In such a manner, the wafers W can be reliably pressed by each of the divided pressing members 25.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

A container for housing a wafer according to the present disclosure is preferably used as, for example, a container for housing a wafer, for use in a semiconductor wafer.

REFERENCE SIGNS LIST

1 Container for transporting semiconductor wafer
10 Container body
11 Opening
12 Mounter
13 Housing
14 Body side wall
14a Auxiliary wall (guide)
14b Wall surface
14c Wall surface (guide element)
14d Rib
15 Arc-shaped mating surface
16 Linear-shaped mating surface
16a Surface
17 Guiding groove
17a Sloped surface
17b Vertical surface
20 Cover
21 Cover side wall
21a Linked wall surface
21b Notch
22 Cover outer wall
22a Inner wall surface (guide element)
23 Cover top panel
24 Recess
25 Pressing member
25a Thick wall 26 Swing shaft
27 Pressing face bar
28 Upper presser
30 Retention mechanism
31 Locking detent projection
32 Locking member
33 Locking hole
34 Locking surface
40 Guide member
41 Rib
51 Ring spacer
52 Interlayer sheet
60 Guide
61 Guide element
62 Guide element
D Spacing
W Wafer

The invention claimed is:

1. A container for transporting a semiconductor wafer, the container comprising:
 a container body having one end provided with an opening and another end provided with a mounter that faces the opening and on which stacked wafers are housed; and
 a cover that closes the opening, wherein
 the container body comprises:
  body side walls having an arc shape, disposed upright on the mounter, and sectioning a housing that houses the wafers; and
  auxiliary walls having an L-shape disposed upright and folded toward a back surface on both edges of the body side walls,
 in the container body,
  the auxiliary walls have first wall surfaces and second wall surfaces,
  the first wall surfaces are parallel to central lines of the container body that pass-through centers between spacings of the body side walls, the spacings each being defined by two adjacent body side walls of the body side walls,
  the second wall surfaces are parallel to an external shape of the container body and are folded to be orthogonal to the first wall surfaces,
  the edges of the body side walls have a U-shape defined by the body side wall and the auxiliary walls, and
  the second wall surfaces and opened edges of the second wall surfaces are included in first guide elements,
 the cover comprises:
  divided arc-shaped cover side walls;
  linear cover outer walls serving as four sides of the cover; and
  linked wall surfaces linking, to each other, edges of the cover side walls and inner side walls of the cover outer walls, and
 in the cover,
 the linked wall surfaces and the inner side walls are included in second guide elements, and
 the second guide elements are guided along the first guide elements and are configured to keep a concentricity state between the container body and the cover.

\* \* \* \* \*